(12) United States Patent
Chevallier

(10) Patent No.: US 7,057,935 B2
(45) Date of Patent: Jun. 6, 2006

(54) ERASE VERIFY FOR NON-VOLATILE MEMORY

(75) Inventor: Christophe J. Chevallier, Palo Alto, CA (US)

(73) Assignee: Micron Technology, Inc., Boise, ID (US)

( * ) Notice: Subject to any disclaimer, the term of this patent is extended or adjusted under 35 U.S.C. 154(b) by 460 days.

(21) Appl. No.: 09/943,479

(22) Filed: Aug. 30, 2001

(65) Prior Publication Data

US 2003/0048664 A1    Mar. 13, 2003

(51) Int. Cl.
*G11C 16/34*    (2006.01)
(52) U.S. Cl. .......................... 365/185.22; 365/185.21; 365/185.2; 365/185.3; 365/185.29; 365/185.03
(58) Field of Classification Search .......... 365/185.33, 365/185.29, 185.3, 185.22, 185.21, 185.2, 365/185.03
See application file for complete search history.

(56) References Cited

U.S. PATENT DOCUMENTS

| | | | |
|---|---|---|---|
| 5,579,262 A | 11/1996 | Song | 365/185.22 |
| 5,642,311 A | 6/1997 | Cleveland et al. | 365/185.3 |
| 5,646,891 A | 7/1997 | Okamoto | 365/185.22 |
| 5,675,537 A * | 10/1997 | Bill et al. | 365/185.22 |
| 5,835,414 A | 11/1998 | Hung et al. | 365/185.25 |
| 5,898,618 A | 4/1999 | Lakkapragada et al. | 365/185.22 |
| 5,995,417 A | 11/1999 | Chen et al. | 365/185.29 |
| 6,009,014 A | 12/1999 | Hollmer et al. | 365/185.22 |
| 6,081,452 A | 6/2000 | Ohta | 365/185.22 |
| 6,163,484 A | 12/2000 | Uekubo | 365/185.2 |
| 6,172,914 B1 | 1/2001 | Haddad et al. | 365/185.29 |
| 6,219,280 B1 | 4/2001 | Naganawa | 365/185.22 |
| 6,288,944 B1 | 9/2001 | Kawamura | 365/185.22 |
| 6,469,931 B1 * | 10/2002 | Ban et al. | 365/185.08 |
| 6,570,790 B1 * | 5/2003 | Harari | 365/185.29 |
| 2003/0048664 A1 * | 3/2003 | Chevallier | 365/185.22 |

* cited by examiner

Primary Examiner—Andrew Q. Tran
(74) Attorney, Agent, or Firm—Leffert Jay & Polglaze, PA

(57) ABSTRACT

A memory device verify system determines a state of memory cells in a memory. The memory includes a memory array having a plurality of memory cells coupled to bit lines. A verify circuit is coupled to the bit lines to determine if memory cells have a erase level that is within predetermined upper and lower limits. The verify circuit can include first and second comparators. In one embodiment, the first comparator is used to compare a bit line current with an upper first reference current. The second comparator is used to compare a bit line current with a lower second reference current. The comparator circuit is not limited to reference currents, but can use reference voltages to compare to a bit line voltage. The verify circuit, therefore, eliminates the need for separate bit line leakage testing to identify over-erased memory cells. Memory verify methods using two reference signal are also provided.

10 Claims, 4 Drawing Sheets

ERASE VERIFY FOR NON-VOLATILE MEMORY

TECHNICAL FIELD OF THE INVENTION

The present invention relates generally to memory devices and in particular the present invention relates to determining erase levels of memory cells in non-volatile memory devices.

BACKGROUND OF THE INVENTION

The use of non-volatile memory systems that maintain data integrity when a power supply is removed are expanding rapidly in integrated circuit technology. A class of non-volatile memory systems having memory cells which has a source, a drain, a channel, a floating gate over the channel and a control gate are widely used. Two popular types of non-volatile memory designs in this class is the electronically erasable and programmable read only memories (EEPROM) and the FLASH erasable-programmable read only memory (EPROM). The FLASH EPROM or flash memory system allows the simultaneous erasure of multiple memory cells.

The floating gate of the memory cell stores data and the control gate of the memory cell controls the floating gate. The floating gates are generally formed from polysilicon members completely surrounded by an insulator. A memory cell is programmed when a charge is stored on the floating gate. Moreover, a memory cell is unprogrammed, or erased, when the charge is removed from the floating gate.

One method of programming a memory cell is accomplished by applying a potential (e.g., 4–7 V) to its drain and a potential (e.g., 10–15 V) to its control gate programs. This causes electrons to be transferred from the source to the floating gate of the memory cell. One method of erasing a memory cell is accomplished by applying a positive potential (e.g., 10–15 V) to its source while grounding the control gate and letting the drain float. This action removes electrons from the floating gate.

A problem that may be encountered in erasing a memory cell is over-erasure. This occurs when too many electrons are removed from the floating gate during an erase operation. A memory cell whose floating gate has too many electrons removed is called an over-erased cell. An over-erased cell has a slight positive charge that biases the memory cell thereby causing a small current leak. This current leak can cause a false reading. Moreover, during the read mode, an over-erased memory cell may disable a whole column of memory cells in a memory array. Therefore, it is important to locate over-erased cells and correct them. One method of correcting an over-erased cell is accomplished by applying a soft program that applies a predetermined voltage pulse to the control gate of the cell while the bit line is biased. This action eliminates the slight positive charge on the floating gate.

Another problem that may be encountered is under-erased memory cells. Under-erased memory cells occur when not enough electrons are removed from the floating gate during an erase procedure. An under-erased memory cell is corrected by performing another erase procedure.

Currently two separate steps are taken to determine if a memory cell is over-erased or under-erased. First the memory cells are individually checked to determine if they are all erased. Once that step is completed, the memory cells are then checked to see if any cells have been over-erased by checking bit line leakage current. The completion of both steps takes a significant amount of time.

For the reasons stated above, and for other reasons stated below which will become apparent to those skilled in the art upon reading and understanding the present specification, there is a need in the art for a system to determine over-erased and under erased cells using less processing time.

SUMMARY OF THE INVENTION

The above-mentioned problems with memories and other problems are addressed by the present invention and will be understood by reading and studying the following specification.

In one embodiment, a non-volatile memory comprises an array of non-volatile memory cells arranged in columns using bit lines, and a verify circuit selectively coupled to the bit lines to determine if the memory cells have a program level that is within a program level window defined by first and second reference signals.

In another embodiment, a bit line verify system comprises a first comparator to compare a bit line current with a first reference current and produce a first output signal, and a second comparator to compare the bit line current with a second reference current and produce a second output signal.

A memory device with an erase verify system is provided in yet another embodiment. The memory device comprises a memory array having a plurality of memory cells coupled to a bit line, a first comparator to compare a bit line voltage with a first reference voltage and produce a first output signal, and a second comparator to compare the bit line voltage with a second reference voltage and produce a second output signal.

A non-volatile memory comprises an array of non-volatile memory cells arranged in columns using bit lines, and a verify circuit selectively coupled to the bit lines to determine if the memory cells have a program level that is within a program level window defined by first upper and second lower reference signals. Control circuitry is coupled to the verify circuit to determine that the memory cell is erased if the memory cell has a program level within the window. The control circuitry determines that the memory cell is over-erased if the memory cell has a program level greater than the first upper reference signal. The control circuitry determines that the memory cell is under-erased if the memory cell has a program level lower than the second lower reference signal.

A method of erase verifying a non-volatile memory cell is provided in one embodiment, the method comprises generating a first reference current, generating a second reference current, and comparing a bit line current from a column coupled to the non-volatile memory cell with the first reference current and the second reference current.

A method of erase verifying a non-volatile memory cell is provided in another embodiment, the method comprises generating a first reference voltage, generating a second reference voltage, and comparing a bit line voltage from a column coupled to the non-volatile memory cell with the first reference voltage and the second reference voltage.

DETAILED DESCRIPTION OF THE INVENTION

In the following detailed description of the preferred embodiments, reference is made to the accompanying drawings that form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

Figure 1:
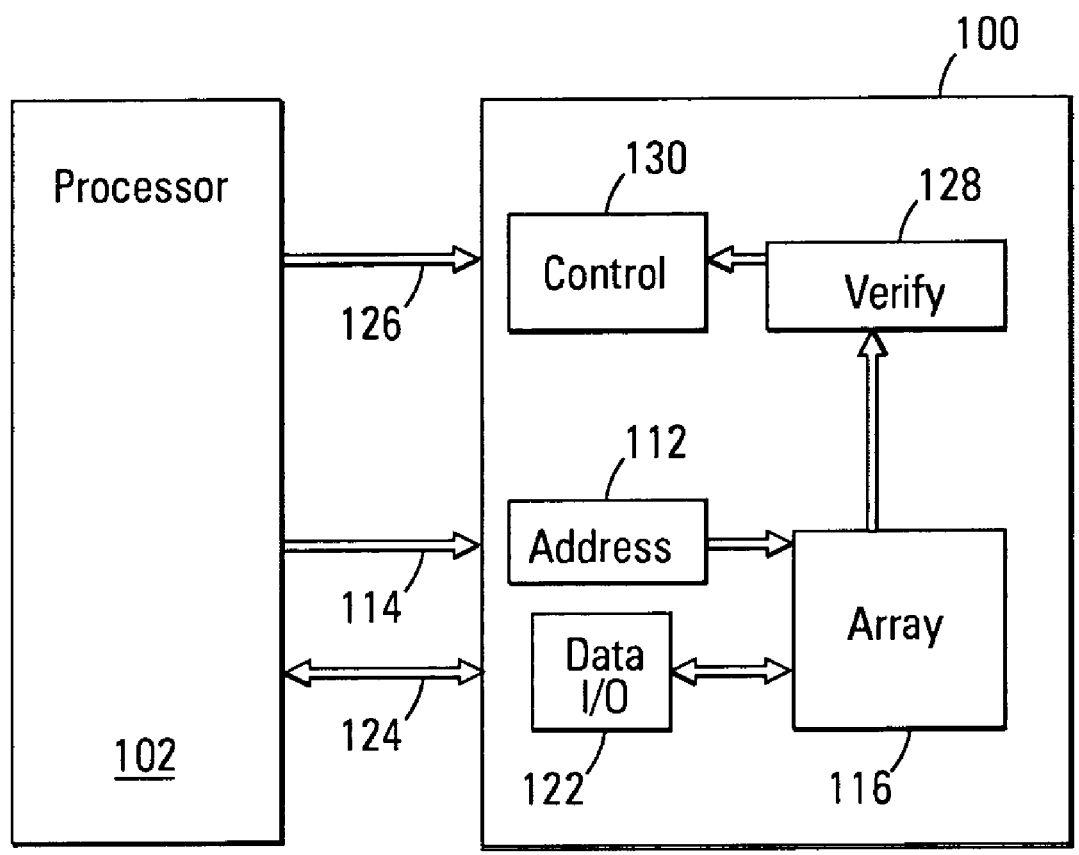
FIG. 1 is a simplified block diagram of a flash memory device of one embodiment of the present invention that is coupled to an external processor.

FIG. 1 illustrates a block diagram of a flash memory device 100 that is coupled to an external processor 102. The memory device 100 has been simplified to focus on features of the memory that are helpful in understanding the present invention. The memory device 100 includes an array 116 of memory cells. The memory cells are preferably floating gate memory cells, and the array 116 is arranged blocks of rows and columns. The blocks allow the memory cells to be erased in large groups. Data, however, is stored in the memory array 116 in small data groups (byte or group of bytes) and separate from the block structure. Erase operations are usually performed on a large number of cells in parallel.

Address decode circuitry 112 is provided to decode address signals provided on address lines A0–Ax 114. Address signals are received and decoded to access the memory array 116. Data input and output buffer circuits 122 are included for bi-directional data communication over a plurality of data (DQ) lines 124 with the external processor 102. Control circuit 130 decodes signals provided on control lines 126 from the external processor 102. These signals are used to control the operations of the memory, including data read, date write, and erase operations, as known to those skilled in the art. Verify circuits 128 are included for verifying the state of a memory cell, as described in detail below.

In addition, state machine(s) can be provided as part of the control circuitry to perform read, write and erase operations. The flash memory may also include a charge pump (not shown) that generates an elevated voltage, Vpp, used during programming of the memory cells and other internal operations. During write operations, Vpp is coupled to the memory cells for providing appropriate write operation programming power. Charge pump designs are known to those skilled in the art, and provide power which is dependent upon an externally provided supply of voltage Vcc.

As stated above, the flash memory of FIG. 1 has been simplified to facilitate a basic understanding of the features of the memory. Further, it will be appreciated that more than one flash memory can be included in various package configurations. For example, flash memory cards can be manufactured in varying densities using flash memories.

Figure 2:
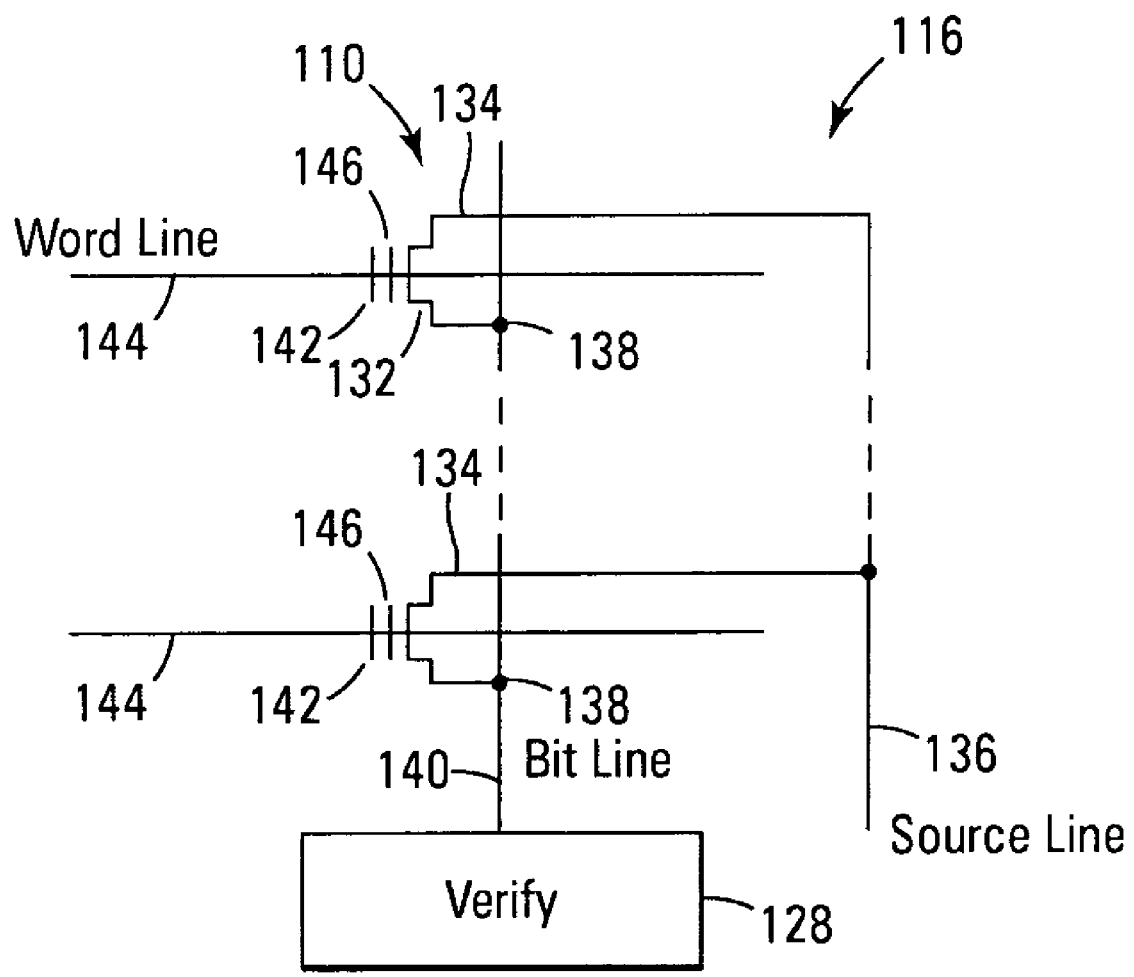
FIG. 2 is a schematic diagram of a memory array coupled to a verify circuit of one embodiment of the present invention.

A more detailed illustration of a flash memory array 130 is provided in FIG. 2. As FIG. 2 illustrates, the memory cells 110 are made up of floating gate transistors 132 that are arranged in a plurality of rows and columns (only one column is illustrated in FIG. 2). In the memory array, the source regions 134 of each memory cell in a row are connected to a common source line 136. The drain regions 138 of each memory cell in a column are connected to a common bit line 140. In addition, control gates 142 of each memory cell 110 in a row are connected to a word line 144. The array of FIG. 2 has been simplified to illustrate the basic arrangement of memory cells and bit lines. Those skilled in the art will appreciate that the schematic diagram has been simplified to focus on the present invention and that additional rows and columns would be implemented to create a complete memory device.

During an erase verify operation, a voltage is applied to word line 144 of a memory cell 110. In response to the word line voltage, the memory cell conducts a current through bit line 140. That is, the memory cell responds to the word line voltage based on a charge of floating gate 146. The level of current in the bit line indicates a state of the memory cell. That is, the memory cell may have an erase state that is either erased, over-erased or under-erased. An erase verify circuit 128, of one embodiment of the present invention, uses the bit line current to determine if memory cells are erased, over-erase or under-erased in a single step. As explained above, prior methods required a first erase verify operation to determine if memory cells are erased. A second operation is then performed to determine if memory cells were over-erased.

Figure 3:
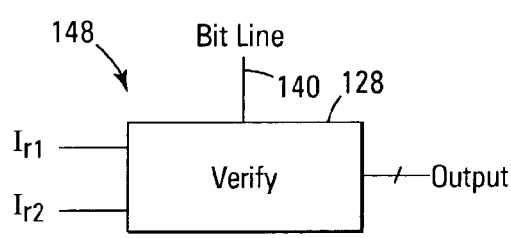
FIG. 3 is a block diagram of a verify circuit of one embodiment of the present invention.

FIG. 3 illustrates a block diagram of the verify circuit 128 with a bit line input 140, two references current inputs and an output(s). The verify circuit can be selectively coupled to a bit line 140 and first and second reference currents, Ir1 and Ir2. The verify circuit compares a bit line current to the two reference currents and provides an output signal that indicated if the bit line current is within a current window defined by two reference currents. In one embodiment, the verify circuit provides multiple output signals.

Figure 4:
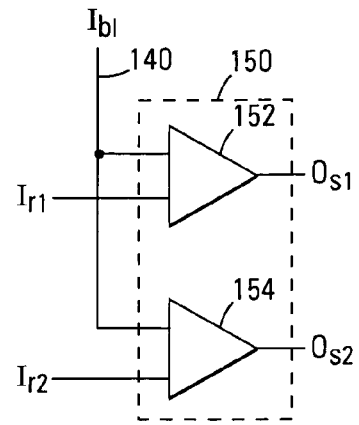
FIG. 4 is a block diagram of a verify circuit of one embodiment of the present invention.

The verify circuit 128 can includes a comparator circuit 150, as illustrated in FIG. 4. The comparator circuit 150 is coupled to the bit line 140 and indicates if the bit line current (Ib1) is within a current window defined by the two reference currents Ir1 and Ir2. The comparator circuit 150 includes first and second comparators 152, 154. The first comparator 152 compares the bit line current (Ib1) with the first reference current (Ir1) and produces a first output signal (Os1). The second comparator circuit 154 compares the bit line current Ib1 with a second reference current (Ir2) and produce a second output signal (Os2). The two output signals can be output from verify circuit 128 or the verify circuit can use the two output signals to determine a state of the bit line current. Sample outputs of the two comparators are illustrated in Table 1.

TABLE 1

| Memory Operation | Os1 | Os2 | Memory Cell State |
|---|---|---|---|
| Ib1 < Ir1 | 0 | 0 | Need Further Erase |
| Ir1 < Ib1 < Ir2 | 1 | 0 | Pass Erase Verify |
| Ib1 > Ir2 | 1 | 1 | Over-Erase |

For example, the first reference current (Ir1) may be set at 50 µA and the second reference current (Ir2) may be set at 90 µA. A 40 µA window, therefore, is defined by these references. It should be noted that these current levels are only used as an example. The reference current levels may vary depending on defined specifications of the memory device being used. According to this example, any current over 90 µA indicates that the bit line 140 is coupled to an over-erased cell and any current under 50 µA indicates a current that would be found in a bit line 140 that was coupled to a memory cell 110 that was under-erased. Referring to Table 2, three possible bit line current (Ib1) levels and the two output signals are illustrated when the reference currents are set at 90 µA and 50 µA.

TABLE 2

| Bit line Current, Ib1 | Os1 | Os2 | Memory Cell State |
|---|---|---|---|
| 40 uA | 0 | 0 | Need Further Erase |
| 70 uA | 1 | 0 | Pass Erase Verify |
| 100 uA | 1 | 1 | Over-Erase |

Figure 5:
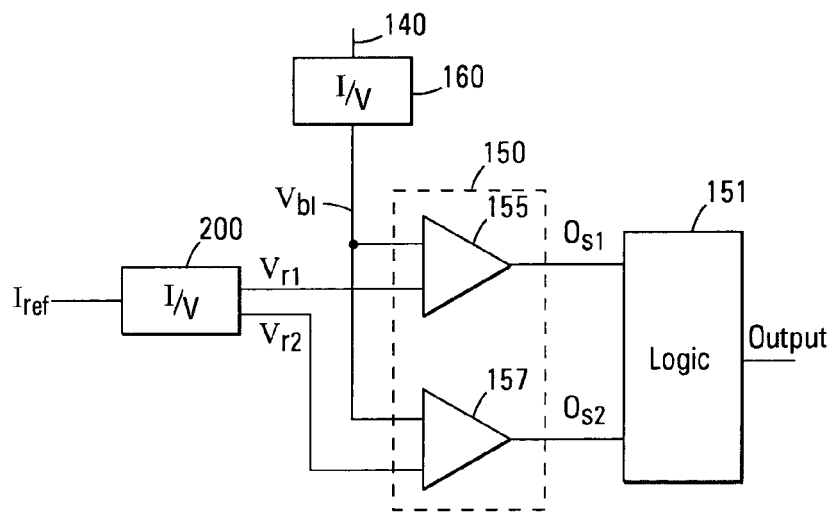
FIG. 5 is a block diagram of another embodiment of a verify circuit of the present invention.

Current comparators and current references of FIG. 4 can be designed as shown in FIG. 5, with current to voltage converters and voltage comparators. Referring to FIG. 5, a comparator circuit 150 compares a bit line voltage 140 with reference voltages, Vr1 and Vr2. In this embodiment, a current-to-voltage converter 160 is used to convert the bit line current to a bit line voltage (Vb1). The current-to-voltage converter 160 is coupled between bit line 140 and first and second voltage comparators 155, 157. A current-to-voltage converter 200 is coupled between a reference current input (Iref) and first and second comparators 155, 157. Thus, the current-to-voltage converter 200 provide a first reference voltage (Vr1) and a second reference voltage (Vr2).

The first comparator 155 of the comparator circuit 150 compares the bit line voltage Vb1 with the first reference voltage Vr1 and produces a first output signal (Os1). The second comparator 157 of the comparator circuit 150 compares the bit line voltage Vb1 with the second reference voltage Vr2 and produces a second output signal (Os2). An optional logic circuit 151 can be provided to process the output signals, Os1 and Os2, and provide a single output to indicate if the bit line has a voltage level within a window defined by Vr1 and Vr1. The logic circuit 151 can be included with verify circuit 128. That is, the embodiments of FIGS. 3, 4, 5 and 6 can each comprise logic circuit 151.

Figure 6:
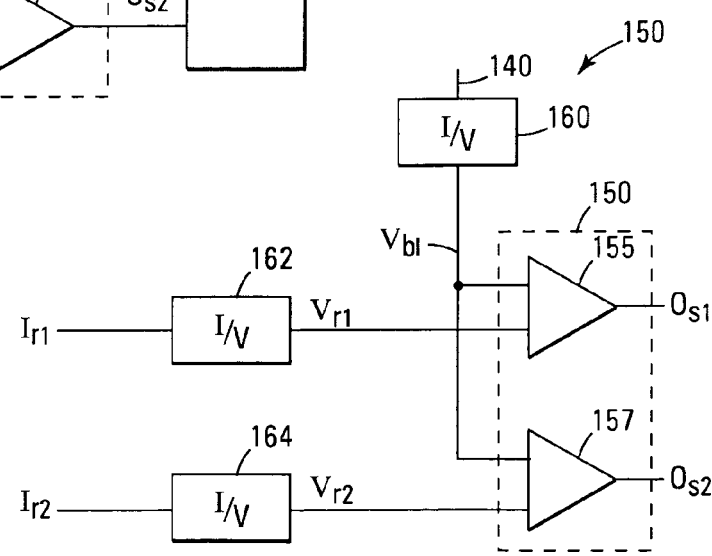
FIG. 6 is a block diagram of another embodiment of a verify circuit of the present invention.

FIG. 6 illustrates an alternate embodiment having first and second current to voltage converters 162 and 164. The first and second current-to-voltage converters provide reference voltages, Vr1 and Vr2, in response to reference currents, Ir1 and Ir2, respectively. Referring to Table 3, three possible bit line voltage (Vb1) levels and the two output signals are illustrated.

TABLE 3

| Bit Line voltage Vb1 | Os1 | Os2 | Memory Cell State |
|---|---|---|---|
| Vb1 > Vr2 | 0 | 0 | Need Further Erase |
| Vr1 < Vb1 < Vr2 | 1 | 0 | Pass Erase Verify |
| Vb1 < Vr1 | 1 | 1 | Over-Erase |

Figure 7:
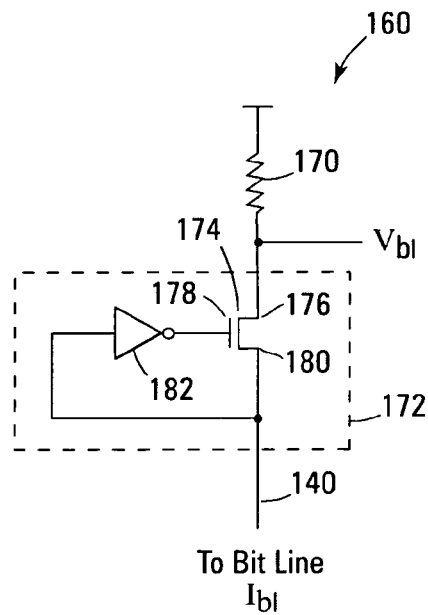
FIG. 7 is a schematic diagram of a bit line current-to-voltage converter of one embodiment of the present invention.

One embodiment of bit line current-to-voltage converter 160 is illustrated in FIG. 7. The bit line current-to-voltage converter 160 includes a resistor 170 and an activation circuit 172. The activation circuit 172 is used to provide a current path through the resistor. The activation circuit can include an activation transistor 174 and an inverter 182. Resistor 170 is coupled to the drain 176 of the activation transistor 174. Inverter 182 is coupled between gate 178 of the activation transistor 174 and source 180 of the activation transistor 174. In addition, source 180 of the activation transistor 174 is further coupled to bit line 140. During operation, the bit line current Ib1 pulls the input of inverter 182 low. The inverter then activates transistor 174 to provide a current path through resistor 170. A voltage drop across the resistor establishes the bit line voltage, Vb1. The voltage output, Vb1, of the bit line current-to-voltage converter 160 can be determined by the following equation: Vb1=Vcc−R(Ib1). While this current-to-voltage converter uses the bit line current to establish the output voltage, similar converters can be used to provide reference voltages.

Figure 8:
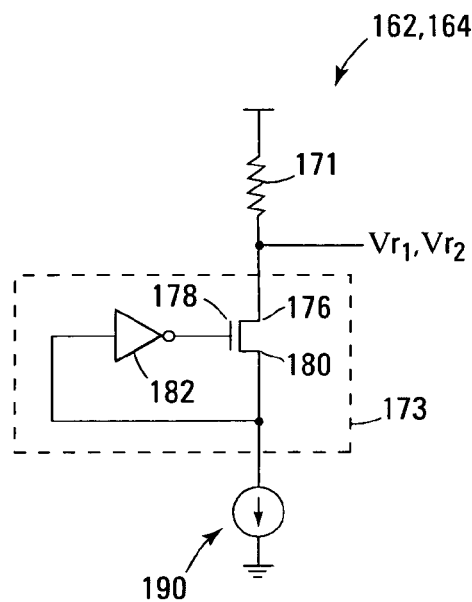
FIG. 8 is a schematic diagram of a reference current-to-voltage converter of one embodiment of the present invention.
Figure 9:
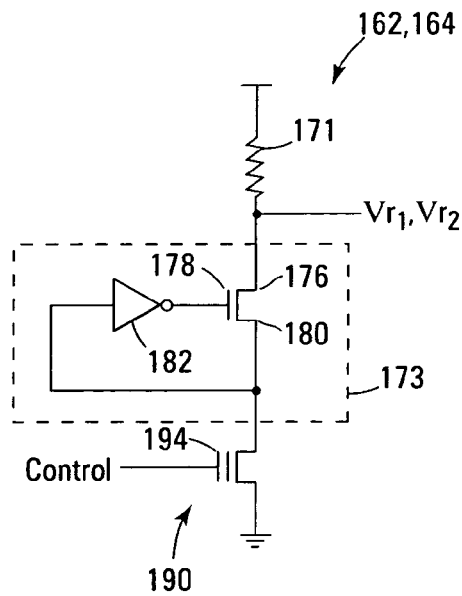
FIG. 9 is a schematic diagram of another embodiment of a reference current-to-voltage converter of the present invention.
Figure 10:
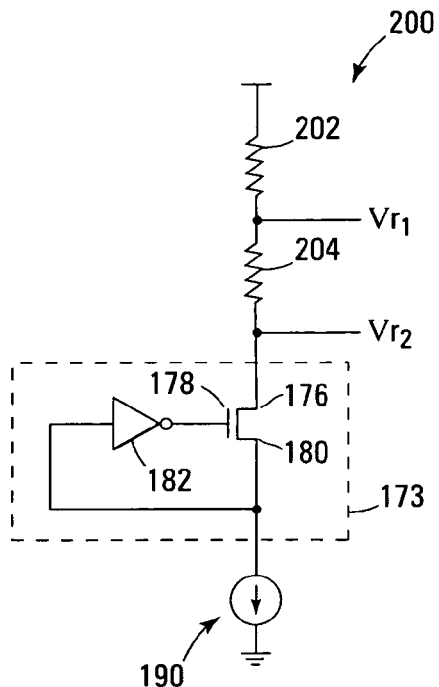
FIG. 10 is a schematic diagram of a reference current-to-voltage converter of one embodiment of the present invention to provide multiple reference voltages.

Referring to FIGS. 8, 9 and 10, three embodiments of current-to-voltage converter circuits are described that can be used to provide reference voltages. One embodiment of a reference current-to-voltage converter 162, 164 is illustrated in FIG. 8. The converter includes a resistor 171, an activation circuit 173 and a reference current source 190. The circuit operates in a manner similar to converter 160, but uses reference current source 190 to establish the voltage drop across resistor 171 to provide Vr1 or Vr2. In another embodiment illustrated in FIG. 9, control current source 190 comprises a floating gate transistor 194 that has been programmed to conduct a specific current in response to a control voltage. Thus, when the control voltage is coupled to the control gate of transistor 194, a reference current flows through activation circuit 173.

Referring to FIG. 10, one embodiment of a dual reference voltage converter circuit 200 is described. Converter 200 provides two reference voltage outputs Vr1 and Vr2 from a single reference current Iref. The converter includes a first resistor (R1) 202, a second resistor (R2) 204, an activation circuit 172 and a reference current circuit 190. As explained above, control current source 190 can comprise a non-volatile memory cell in one embodiment. The first resistor R1 and the second resistor R2 are coupled in series with the activation circuit 173 and the reference current circuit 190. When a current is conducted through the resistors, the first reference Voltage Vr1 and the second reference voltage Vr2 are determined by the following equations: Vr1=Vcc−(R1)(I), and Vr2=Vcc−(R1+R2)(I).

As explained above, the memory includes control circuitry 130 to perform read, program and erase operations on the memory array. The control circuit uses the output(s) of the verify circuit to determine a state of memory cells being erased in one operation step. Thus, if an over-erased cell is detected the control circuitry performs a soft program, or heal operation, to correct over-erased cells. Moreover, if an under-erased cell is detected the control circuitry performs an additional erase procedure.

A typical erase algorithm for a standard stacked one transistor flash cell includes three main phases: 1) pre-program to program all cells; 2) erase to apply erase pulses to the cells and verify until cells are erased; and 3) heal to detect cell leakage and apply a program scheme to over-erased cells. The present invention, the leakage detection step is merged with the verify portion of phase 2. As erase verification is performed, the system determines if the cell is over-erased. The cell address and status information can be latched for use in phase 3, or can be used immediately by applying the heal programming scheme to that cell, column or array.

CONCLUSION

An erase verify system has been described that determines a state of memory cells in a non-volatile memory. The memory includes a non-volatile memory array having a plurality of memory cells coupled to bit lines. A verify circuit is coupled to the bit lines to determine if memory cells have a erase level that is within predetermined upper and lower limits. The verify circuit can include first and second comparators. The first comparator is used to compare a bit line current with an upper first reference current. The second comparator is used to compare a bit line current with a lower second reference current. The comparator circuit is not limited to reference current, but can use reference voltages and a bit line voltage. The verify circuit, therefore, eliminates the need for separate bit line leakage testing to identify over-erased memory cells. Methods of detecting a bit line current have also been described.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A non-volatile memory comprising:
   an array of non-volatile memory cells arranged in columns using bit lines; and
   a verify circuit selectively coupled to the bit lines to determine if the memory cells have an erase level that is within an erase level window defined by first and second reference signals, the circuit generating an indication of one of under-erasure, erasure, or over-erasure in response to a position of the erase level with the erase level window.

2. The non-volatile memory of claim 1 wherein the verify circuit comprises:
   a first comparator with a reference input coupled to receive the first reference signal, and a second input coupled to the selected one of the bit lines; and
   a second comparator with a reference input coupled to receive the second reference signal and a second input coupled to the selected one of the bit lines.

3. The non-volatile memory of claim 1 wherein the memory cells comprise a plurality of floating gate memory cells.

4. The non-volatile memory of claim 1 wherein the indication is a "00" for under-erasure, a "10" for erasure, and a "11" for over-erasure.

5. The non-volatile memory of claim 1 wherein the indication is a logical indication.

6. The non-volatile memory of claim 1 wherein the erase level window indicates a current level.

7. The non-volatile memory of claim 6 wherein the first and second reference signals are current signals.

8. A non-volatile memory comprising:
   an array of non-volatile memory cells arranged in a row and column format such that the columns comprise bit lines including a selected bit line having a bit line current; and
   a plurality of comparators for generating indication signals in response to a comparison of the bit line current with a plurality of reference currents each coupled to a comparator, each reference current indicating a different limit of an erase level window, each comparator generating an indication of one of under-erasure, erasure, or over-erasure in response to the comparison.

9. The non-volatile memory of claim 8 wherein the plurality of comparators comprise a first comparator that compares the bit line current to a lower limit reference current and a second comparator that compares the bit line current to an upper limit reference current.

10. The non-volatile memory of claim 9 wherein a bit line current that is less than the upper limit reference current and greater than the lower limit reference current is a current indicating erasure.

* * * * *